(12) United States Patent
Xu et al.

(10) Patent No.: US 8,662,412 B2
(45) Date of Patent: Mar. 4, 2014

(54) ADVANCED MODIFIED HIGH PERFORMANCE SYNTHETIC JET ACTUATOR WITH CURVED CHAMBER

(75) Inventors: Tian-Bing Xu, Hampton, VA (US); Ji Su, Yorktown, VA (US); Xiaoning Jiang, State College, PA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 1014 days.

(21) Appl. No.: 12/354,808

(22) Filed: Jan. 16, 2009

(65) Prior Publication Data

US 2010/0043900 A1    Feb. 25, 2010

Related U.S. Application Data

(60) Provisional application No. 61/091,510, filed on Aug. 25, 2008.

(51) Int. Cl.
*B05B 1/08* (2006.01)

(52) U.S. Cl.
USPC ..................... 239/102.2; 239/102.1

(58) Field of Classification Search
USPC ........................................ 239/102.2, 102.1
See application file for complete search history.

(56) References Cited

U.S. PATENT DOCUMENTS

| | | | | |
|---|---|---|---|---|
| 4,465,234 A * | 8/1984 | Maehara et al. | ............ | 239/102.2 |
| 4,550,325 A * | 10/1985 | Viola | ................ | 347/68 |
| 4,702,418 A * | 10/1987 | Carter et al. | ................... | 239/101 |
| 5,261,601 A * | 11/1993 | Ross et al. | .................. | 239/102.2 |
| 5,758,823 A * | 6/1998 | Glezer et al. | ...................... | 239/4 |
| 6,971,383 B2 * | 12/2005 | Hickey et al. | ............ | 128/203.15 |
| 7,066,398 B2 * | 6/2006 | Borland et al. | ............ | 239/102.2 |
| 7,252,085 B2 * | 8/2007 | Kunschir | ................. | 128/200.16 |
| 2006/0243820 A1 * | 11/2006 | Ng | ............................. | 239/102.1 |

\* cited by examiner

*Primary Examiner* — Davis Hwu

(74) *Attorney, Agent, or Firm* — Jennifer L. Riley; Thomas K. McBride, Jr.

(57) ABSTRACT

The advanced modified high performance synthetic jet actuator with optimized curvature shape chamber (ASJA-M) is a synthetic jet actuator (SJA) with a lower volume reservoir or chamber. A curved chamber is used, instead of the conventional cylinder chamber, to reduce the dead volume of the jet chamber and increase the efficiency of the synthetic jet actuator. The shape of the curvature corresponds to the maximum displacement (deformation) profile of the electroactive diaphragm. The jet velocity and mass flow rate for the ASJA-M will be several times higher than conventional piezoelectric actuators.

5 Claims, 5 Drawing Sheets

Metal

Figure 1:
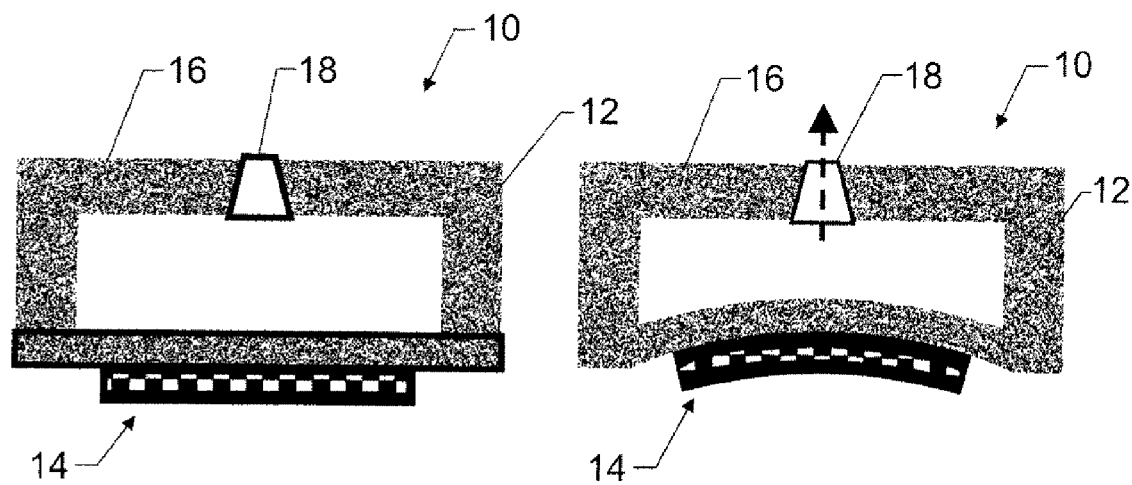
Figure 1:
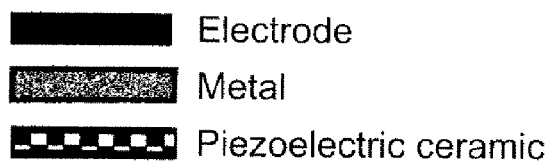

Piezoelectric (a) No voltage applied          (b) A voltage applied (a) No voltage applied    (b) A voltage applied (a) No voltage applied    (b) A voltage applied (a) No voltage applied (b) A voltage applied (c)

ADVANCED MODIFIED HIGH PERFORMANCE SYNTHETIC JET ACTUATOR WITH CURVED CHAMBER

CROSS-REFERENCE TO RELATED APPLICATIONS

This patent application claims the benefit of U.S. Provisional Patent Application No. 61/091,510, filed Aug. 25, 2008.

ORIGIN OF THE INVENTION

The invention was made in part by an employee of the United States Government and may be manufactured and used by and for the Government of the United States for governmental purposes without the payment of any royalties thereon or therefore. Pursuant to 35 U.S.C. §119, the benefit of priority from provisional application 61/091,510, with a filing date of Mar. 25, 2008, is claimed for this non-provisional application.

FIELD OF THE INVENTION

The present invention relates generally to synthetic jet actuators and, more particularly, relates to synthetic jet actuators with curved chambers.

BACKGROUND OF THE INVENTION

Active flow control changes the paradigm of aerodynamic design of current and future wing-borne systems in subsonic, transonic and supersonic flow. Active flow control should be an inherent input to the conceptual design of the next generation of commercial and military flight vehicles. Retrofitted to current fixed-wing aircraft, active flow control can "clean up" complex three-dimensional, external flow separations on the wing top surface particularly severe under maneuvering conditions. Active flow control can inhibit flow distortion at the compressor face in supersonic inlets emanating from shock/boundary-layer interactions on the inlet sidewalls, at the inlet throat, and in the subsonic diffuser. Active flow control makes feasible aerodynamic design for high lift/drag ratios at cruise and efficient subsonic/transonic performance at off-design conditions, taking into account environmental and performance constraints. The outcome is a reduction in overall drag of the vehicle, alleviation of unsteady loads and prevention of the expulsion of the inlet shock system (that may lead to catastrophic loss of the airframe).

It is known to use a synthetic jet (also termed a zero net mass flux jet) to influence the flow over a surface, for example to control flow separation from an airfoil. An isolated synthetic jet is produced by the interactions of a train of vortices that are typically formed by alternating momentary ejection and suction of fluid through an orifice of an actuator. A typical synthetic jet actuator (SJA) comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Various volume changing mechanisms are known, for example a piston positioned in the jet housing to move so that fluid is moved in and out of the orifice during reciprocation of the piston, or a flexible diaphragm as a wall of the housing. The flexible diaphragm is typically actuated by a piezoelectric actuator or other appropriate means.

A conventional SJA configuration is shown in FIGS. 1(a) and 1(b). The conventional SJA 10 comprises a metal cylinder 12 with an active diaphragm 14 on the bottom, and a passive diaphragm 16 on the top. In the center of the top diaphragm is a circular inlet/outlet orifice 18. The active diaphragm comprises a unimorph that in turn comprises a thin strip of piezoelectric material (e.g., ceramic) bonded to a strip of metal (e.g., brass). Electrodes are positioned on either side of the strip of piezoelectric material in order to apply a voltage (the connections to the electrodes and the power source are not illustrated in FIG. 1).

When voltage is not applied to the active diaphragm, the active diaphragm is substantially flat as shown in FIG. 1(a). When a voltage is applied to the active diaphragm, the active diaphragm flexes upward as shown in FIG. 1(b). This upward flexing of the active diaphragm reduces the volume of the chamber and causes air to be jetted out (as illustrated by the dashed arrow). For the conventional SJA, a negative transverse strain mode is used in the diameter direction of the piezoelectric diaphragm. This limits the displacement of the bottom diaphragm for two reasons: (1) piezoelectric transverse strain in ceramics and single crystals is about half of its longitudinal strain; and (2) the negative transverse strain induces the ceramic component to shrink along its diameter direction, reducing the flexing displacement of the diaphragm.

In the past a few years, a number of computational fluid dynamics studies have indicated that SJAs have the potential to be used for active flow control in supersonic, hypersonic, and subsonic vehicles. A number of theoretical studies indicate that the synthetic jet actuator is one of the most efficient devices for flow control. According to these studies, the interaction of synthetic jets with an external cross flow over the surface on which they are mounted can displace the local streamlines and can induce an apparent or virtual change in the shape of the surface, thereby effecting flow changes on length scales that are one to two orders of magnitude larger than the characteristic scale of the jets. Global control of the aircraft will be enhanced, using this new-generation control structure. A number of experimental studies have demonstrated this effect, but they have shown that jet velocity is not high enough to be used at supersonic speeds. Unfortunately, the jet velocity and mass flow rate of currently existing SJAs are not high enough to meet the needs of active dynamic controls for space missions. In today's technological climate, there is a strong impetus to develop piezoelectric synthetic jet actuators with jet velocities of over 150 meters per second (m/s) at non-resonance working mode.

BRIEF SUMMARY OF THE INVENTION

The advanced modified high performance electroactive synthetic jet actuator (ASJA-M) is a synthetic jet actuator with a curved chamber. The novel ASJA-M can provide active aerodynamic control for supersonic, hypersonic, and subsonic fixed wing aircraft and subsonic rotary wing aircraft.

In one embodiment of the invention, a synthetic jet actuator comprises a curved roof and an electroactive diaphragm. The curved roof and the electroactive diaphragm are joined to form a chamber, and the curved roof defines an orifice therethrough. The orifice has a generally frustoconical shape The positive strain and negative strain of the electroactive diaphragm are configured such that, when voltage is applied to the electroactive diaphragm, a diameter of the electroactive diaphragm increases, thereby causing a center of the electroactive diaphragm to flex toward the curved roof.

The shape of the inside surface of the curved roof corresponds to the shape of the inside surface of the electroactive diaphragm when the electroactive diaphragm is maximally displaced. The size of the curved roof is selected such that the inside surface of the electroactive diaphragm contacts the inside surface of the curved roof when the electroactive diaphragm is maximally displaced.

The electroactive diaphragm may comprise a layer of electroactive material bonded to a layer of metal. The electroactive material layer may comprise multiple concentric cylinders of electroactive material. Alternatively, the electroactive diaphragm may comprise two layers of electroactive material.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 1(a) and (b) are simplified cross-sectional schematic views of a conventional synthetic jet actuator.

Figure 3:
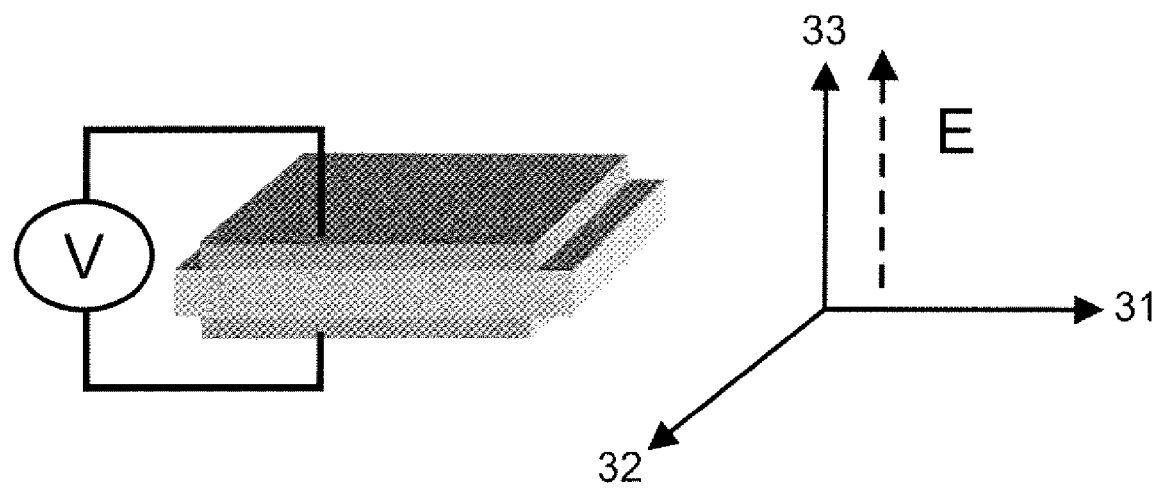
Figure 4:
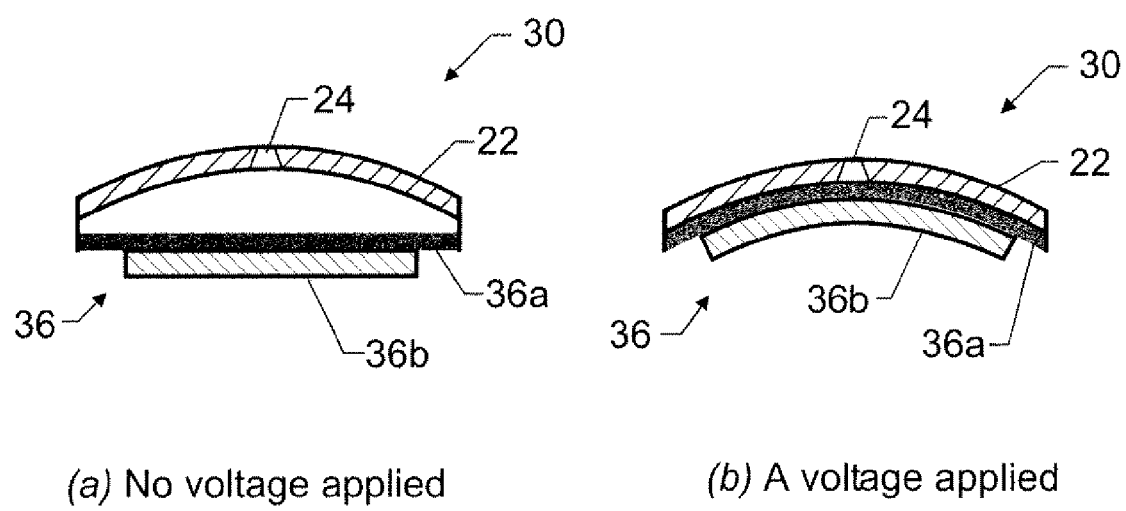
Figure 5:
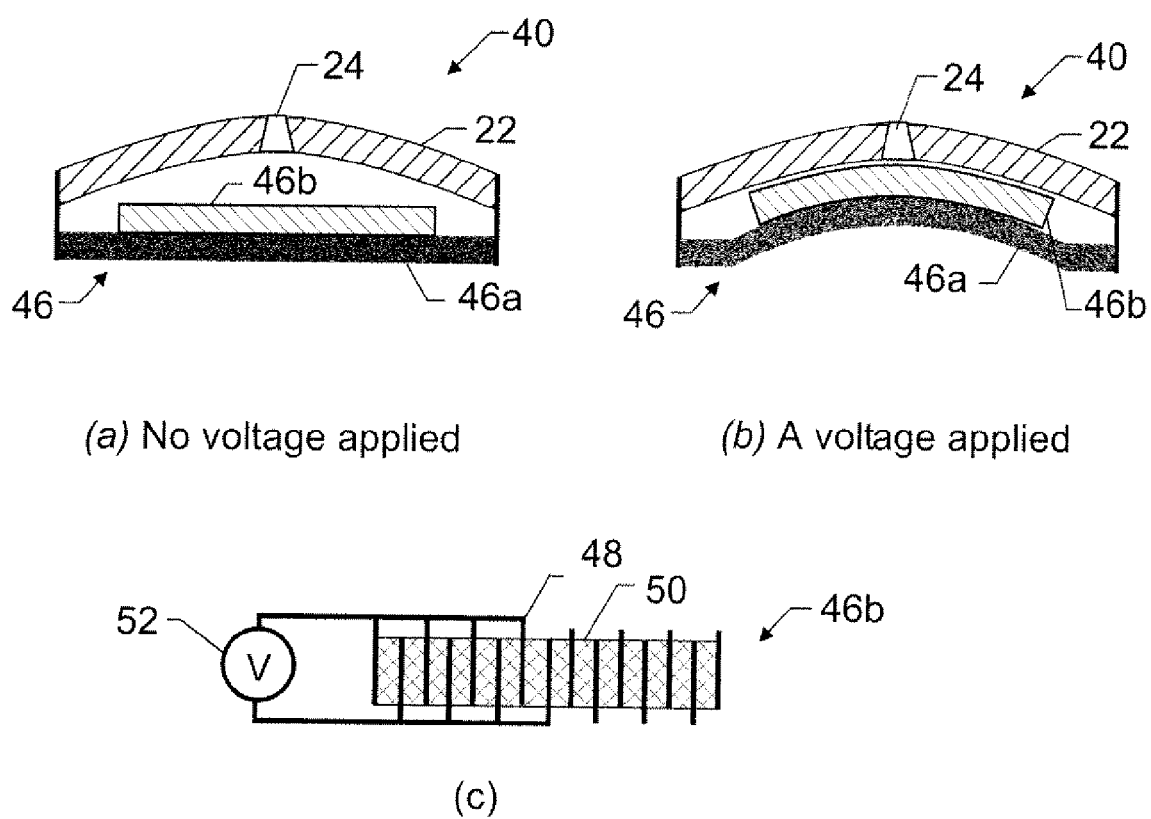

FIGS. 2(a) and (b) are simplified cross-sectional schematic views of an advanced modified electroactive synthetic jet actuator (ASJA-M), in accordance with embodiments of the present invention;

FIG. 3 illustrates the characteristics of electro-mechanical response in electroactive materials;

FIGS. 4(a) and (b) are simplified cross-sectional schematic views of an advanced modified electroactive synthetic jet actuator (ASJA-M), in accordance with alternate embodiments of the present invention; and FIGS. 5(a), (b), and (c) are simplified cross-sectional schematic views of an advanced modified electroactive synthetic jet actuator (ASJA-M), in accordance with alternate embodiments of the present invention.

DETAILED DESCRIPTION OF THE INVENTION

The present invention now will be described more fully hereinafter with reference to the accompanying drawings in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The advanced modified high performance synthetic jet actuator with optimized curvature shape chamber (ASJA-M) is a synthetic jet actuator (SJA) with a lower volume reservoir or chamber. A curved chamber is used, instead of the conventional cylinder chamber, to reduce the dead volume of the jet chamber and increase the efficiency of the synthetic jet actuator. The shape of the curvature corresponds to the maximum displacement (deformation) profile of the electroactive diaphragm. This enhances the mass flow rate so that it is many times greater than that of a conventional SJA. In order to reduce the applied voltage and increase the force output of the ASJA-M, a multilayer single crystal element may be used for the piezoelectric diaphragm. The ASJA-M is thin enough to install into the surfaces of rotorcraft blades or airfoils of a fixed wing aircraft.

Figure 2:
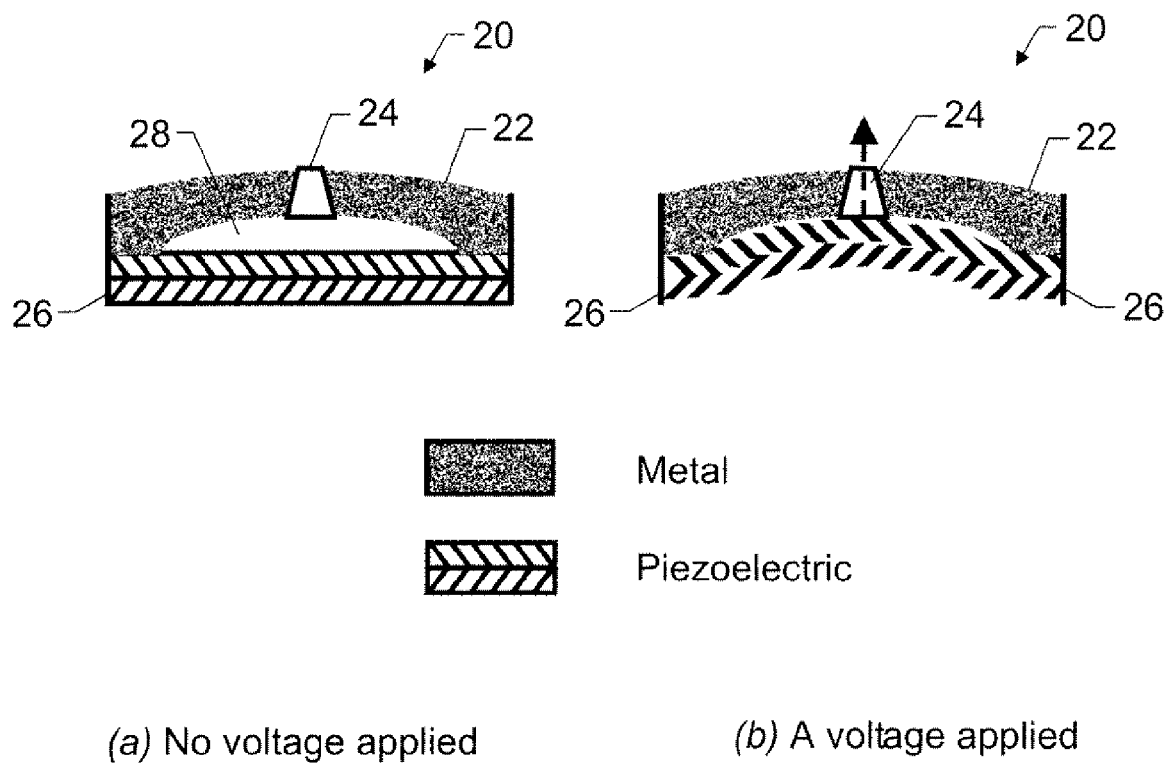

For the ASJA-M shown in FIG. 2, only one single electroactive component (i.e., the bottom diaphragm) is employed. By using a single electroactive element, there is no requirement to consider matching electroactive components during device design. The electroactive diaphragm can be a unimorph or bimorph. The electroactive diaphragm can also be a transverse strain unimorph (the same as the conventional SJA as shown in FIG. 1) or a longitudinal strain multilayer unimorph as shown in FIG. 4, as long as the SJA is designed such that the inside curvature of the metal chamber corresponds to the bending displacement of the electroactive diaphragm.

Referring now to FIGS. 2(a) and (b), simplified cross-sectional schematic views of an advanced modified high performance electroactive synthetic jet actuator (ASJA-M) are illustrated in accordance with embodiments of the present invention. FIG. 2(a) illustrates the ASJA-M when no voltage is applied, and FIG. 2(b) illustrates the ASJA-M when a voltage is applied. The ASJA-M 20 of FIGS. 2(a) and (b) comprises a curved roof 22 and an electroactive diaphragm 26. The curved roof and the electroactive diaphragm are joined (the bottom edge of the roof is joined to the outer edge of the diaphragm) to form a chamber 28. The curved roof defines an orifice 24 therethrough, through which air is jetted out of the chamber when the diaphragm flexes upward. The orifice typically has a generally frustoconical shape (such that the top and bottom openings are circular), frustopyramidal shape (such that the top and bottom openings are square), or may have an elongated shape (i.e., a slot).

The positive strain and negative strain of the electroactive diaphragm 26 are configured such that, when voltage is applied to the electroactive diaphragm, a diameter of the electroactive diaphragm increases, thereby causing a center of the electroactive diaphragm to flex toward the curved roof as illustrated in FIG. 2(b). The shape of the inside surface of the curved roof corresponds to the shape of the inside surface of the electroactive diaphragm when the electroactive diaphragm is maximally displaced. Similarly, the size of the curved roof is selected such that the inside surface of the electroactive diaphragm contacts the inside surface of the curved roof when the electroactive diaphragm is maximally displaced. This selection of size and shape of the roof enables the volume of the chamber 28 to be greatly reduced (to zero or near zero) when voltage is applied to the diaphragm, thereby enabling expulsion of much or all of the air from the chamber.

The electroactive diaphragm may be an electroactive metal composite unimorph or an electroactive bimorph. In the embodiment illustrated in FIG. 2, the electroactive diaphragm 26 is a bimorph that comprises two layers of electroactive material. The electroactive layers are constructed of, for example, piezoelectric material such as ceramic or crystal. FIGS. 2(a) and (b) illustrate one of the alternate diaphragm configurations, while FIGS. 4(a) and (b) and FIGS. 5(a)-(c) illustrate two other alternate diaphragm configurations.

In order to optimize the design of the present ASJA-M, it is desirable to study the characteristics of the electromechanical response in electroactive ceramics/single crystals first as illustrated in FIG. 3. For a piezoelectric material 30 (which, as illustrated in FIG. 3, is bonded to conductors on opposing sides to enable a voltage to be applied to the material), the electric field direction is depicted by the dashed arrow labeled "E." The electric field induces a strain in direction 33 that is parallel to the electric field direction, and this strain is termed a longitudinal strain and is referred to as $S_{33}$. The electric field also induces strains in the two directions 31, 32 that are perpendicular to the electrical field directions, and these strains are termed transverse strains and are referred to as $S_{31}$ and $S_{32}$. For inorganic piezoelectric materials, such as ceramics or single crystals, the longitudinal strains are positive and the transverse strains are negative. Normally, $S_{33} \approx -2S_{31} \approx -2S_{32}$. With different multilayer configurations, one can obtain a special component which can offer either positive or negative strain in a certain direction to form a hybrid actuation system.

On addition to the diaphragm illustrated in FIG. 2, the electroactive diaphragm can be a negative transverse strain based diaphragm (substantially the same as the diaphragm in the conventional SJA of FIG. 1), as shown in FIGS. 4(a) and (b), or a multilayer electroactive cylinder based ceramic—metal unimorph diaphragm as shown in FIGS. 5(a)-(c). Referring now to FIGS. 4(a) and (b), simplified cross-sectional schematic views of an alternate ASJA-M are illustrated. The embodiment of FIGS. 4(a) and (b) uses a conventional electroactive diaphragm. FIG. 4(a) illustrates the ASJA-M 30 when no voltage is applied to the electroactive diaphragm, and FIG. 4(b) illustrates the ASJA-M 30 when voltage is applied to the electroactive diaphragm. The electroactive diaphragm 36 of FIGS. 4(a) and (b) comprises a metal plate 36a and an electroactive layer 36b bonded to the bottom side (i.e., the side opposite the chamber) of the metal plate. For clarity, the conductors on opposing sides of the electroactive layer are not illustrated. When a voltage is applied along its thickness direction, the diameter of the electroactive layer decreases. This decrease in diameter of the electroactive layer makes the entire diaphragm flex upward into a curved layer, as show in FIG. 4(b), due to the reaction between the metal layer and the electroactive layer. Because of the decrease of the diameter of the electroactive layer, the overall force of the electroactive layer acting on the metal layer is equivalent to a uniform force (pressure) applied from the downside to the upside—thereby causing the upward flex. The portion of the metal layer which is bonded to the electroactive layer either slightly increases or slightly decreases along the diameter direction (depending on the design), while the portion of the metal layer that is not bonded to the electroactive layer increases a greater amount along the diameter direction. The different reactions of the different portions of the metal layer are desirable, which is why the diameter of the electroactive layer is smaller than the diameter of the metal layer. The diameter of the electroactive layer is smaller than the inner diameter of the bottom edge of the roof 32 (i.e., where the roof is joined to the diaphragm) to enable the diaphragm to flex to get optimized deformation.

Referring now to FIGS. 5(a) and (b), simplified cross-sectional schematic views of another alternate ASJA-M are illustrated. The embodiment of FIGS. 5(a) and (b) uses an electroactive material layer that comprises multiple concentric cylinders of electroactive material. FIG. 5(a) illustrates the ASJA-M 40 when no voltage is applied to the electroactive diaphragm, and FIG. 5(b) illustrates the ASJA-M 40 when voltage is applied to the electroactive diaphragm. The diaphragm 46 of FIGS. 5(a) and (b) comprises a metal plate 46a and a multilayer electroactive layer 46b bonded to the top side (i.e., the side toward the chamber) of the metal plate. For clarity, the conductors between the multiple layers are not illustrated in FIGS. 5(a) and (b). When a voltage is applied along its diameter direction, the diameter of the electroactive layer increases. This increase in diameter makes the entire diaphragm flex upward into a curved shape as shown in FIG. 5(b). The diameter of the electroactive layer is smaller than the inner diameter of the bottom edge of the roof 32 (i.e., where the roof is joined to the diaphragm) to enable the diaphragm to flex. Since the longitudinal strain is two times larger than the transverse strain for the same electric field, the flexing displacement is $2^{0.5}$ times the flexing displacement of the conventional horizontal ASJA, shown in FIG. 1(b).

The multilayer electroactive layer 46b is formed with a plurality of concentric (nested), thin, short cylinders 50. Any desired number of layers or cylinders may be used. As illustrated in FIG. 5(c), each opposing inner and outer side of each layer 50 contacts an electrical conductor layer 48. Two of the conductors (the outermost conductor and the innermost conductor) contact only one electroactive layer, while the remaining conductors are positioned between electroactive layers and therefore contact the two electroactive layers between which the conductor lies. Each conductor is electrically connected to a voltage source 52 (alternating ones of the conductors are electrically connected to the positive terminal of the voltage source or to the negative terminal of the voltage source).

The ASJA-M of embodiments of the invention can be used in broad areas of dynamic control. Each aircraft needs several dozen of this kind of device for local aerodynamic control. In addition, underwater facilities also need this kind of device for control and detection.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A synthetic jet actuator comprising:
a curved roof; and
an electroactive diaphragm;
wherein the curved roof and the electroactive diaphragm are joined to form a chamber;
wherein the curved roof defines an orifice therethrough having zero net mass flux from the chamber when said actuator is operated by application and removal of voltage to the electroactive diaphragm;
wherein a positive strain and a negative strain of the electroactive diaphragm are configured such that, when voltage is applied to the electroactive diaphragm, a diameter of the electroactive diaphragm increases, thereby causing a center of the electroactive diaphragm to flex toward the curved roof and said diaphragm to form a corresponding curved surface; and
wherein the inside surface of the curved roof is sized to contact the corresponding curved surface of the electroactive diaphragm such that, when the electroactive diaphragm is maximally displaced, the chamber volume is reduced to zero.

2. The synthetic jet actuator of claim 1, wherein the electroactive diaphragm comprises a layer of electroactive material bonded to a layer of metal.

3. The synthetic jet actuator of claim 2, wherein the electroactive material layer comprises multiple concentric cylinders of electroactive material.

4. The synthetic jet actuator of claim 1, wherein the electroactive diaphragm comprises two layers of electroactive material.

5. The synthetic jet actuator of claim 1, wherein the orifice has a generally frustoconical shape.

* * * * *